United States Patent
Jang

[11] Patent Number: 6,022,802
[45] Date of Patent: Feb. 8, 2000

[54] LOW DIELECTRIC CONSTANT INTERMETAL DIELECTRIC (IMD) BY FORMATION OF AIR GAP BETWEEN METAL LINES

[75] Inventor: Syun-Ming Jang, Hsin-Chu, Taiwan

[73] Assignee: Taiwan Semiconductor Manufacturing Company, Hsin-Chu, Taiwan

[21] Appl. No.: 09/270,592

[22] Filed: Mar. 18, 1999

[51] Int. Cl.[7] .................................................. H01L 21/764
[52] U.S. Cl. ......................... 438/656; 438/688; 438/421; 438/422
[58] Field of Search ..................... 438/688–689, 438/656, 619, 699, 671, 421, 422, 224, 225

[56] References Cited

U.S. PATENT DOCUMENTS

| | | | |
|---|---|---|---|
| 5,192,715 | 3/1993 | Sliwa, Jr. et al. | 437/195 |
| 5,407,860 | 4/1995 | Stoltz et al. | 437/180 |
| 5,461,003 | 10/1995 | Havemann et al. | 437/187 |
| 5,559,055 | 9/1996 | Chang et al. | 438/586 |
| 5,641,712 | 6/1997 | Grivna et al. | 438/624 |
| 5,708,303 | 1/1998 | Jeng | 257/758 |
| 5,880,026 | 3/1999 | Xing et al. | 438/688 |
| 5,904,566 | 5/1999 | Tao et al. | 438/689 |

*Primary Examiner*—Charles Bowers
*Assistant Examiner*—Thanh Nguyen
*Attorney, Agent, or Firm*—George O. Saile; Stephen B. Ackerman

[57] ABSTRACT

A method for forming a dielectric layer within a microelectronics fabrication. There is first provided a substrate layer formed upon a substrate employed within a microelectronics fabrication. There is then formed upon the substrate layer a pair of patterned titanium nitride conductor layers upon which is formed a pair of aluminum containing conductor layers to provide a pair of patterned conductor stack layers. There is then formed over the patterned conductor stack layers a silicon oxide dielectric layer formed employing an ozone assisted sub-atmospheric pressure thermal chemical vapor deposition (SACVD) method employing tetra-ethyl-ortho-silicate (TEOS) as the silicon source material, where the silicon oxide dielectric layer defines at least in part a series of voids formed interposed between the patterned conductor stack layers. The substrate layer composition, the patterned conductor stack layer separation, the titanium nitride layer thickness, and at least one of the SACVD method parameters of deposition pressure or deposition temperature are selected such that the series of voids within the silicon oxide gap filling dielectric layer are interposed between the pair of patterned conductor stack layers.

11 Claims, 3 Drawing Sheets

LOW DIELECTRIC CONSTANT INTERMETAL DIELECTRIC (IMD) BY FORMATION OF AIR GAP BETWEEN METAL LINES

CROSS-REFERENCE TO RELATED APPLICATION

The present application is related to co-assigned application Ser. No. 08/518,706, filed Aug. 24, 1995, now U.S. Pat. No. 5,518,959.

BACKGROUND OF THE INVENTION

1. Field of the Invention

The invention relates to methods for the fabrication of dielectric separation layers between conductor layers in microelectronics fabrications. More particularly, the invention relates to methods for fabrication of relatively low dielectric constant dielectric layers between conductor layers in microelectronics fabrications.

2. Description of the Related Art

Microelectronics fabrications are formed from microelectronics substrates over which are formed patterned microelectronics conductor layers which are separated by dielectric layers.

As the level of integration of microelectronics devices has increased and the dimensions of microelectronics devices have decreased, the spacing between adjacent conductor layers carrying current has correspondingly decreased.

Similarly, in accord with the desire for higher performance, speeds of electrical circuit operation have increased greatly. Such higher speeds typically require minimization of parasitic capacitance in conductor layers adjacent to signal carrying layers to decrease time required for charging of stray capacitances, and capacitive coupling between adjacent signal conductor lines minimized in order to attenuate cross-talk and distortion due to excessive capacitive coupling. For these reasons, it has become common to employ low relative dielectric constant dielectric layers formed interposed between patterned microelectronics conductor layers within microelectronics fabrications. As is understood by persons skilled in the art, the relative dielectric constant of a dielectric material is the ratio between the dielectric constant of the material and the dielectric constant of empty space, which is taken as unity; thus the relative dielectric constant will be numerically equal to that ratio, and will be referred to as the dielectric constant of the material.

Of the methods and materials which may be employed for forming low dielectric constant dielectric layers interposed between the patterns of patterned microelectronics conductor layers within microelectronics fabrications, methods which provide dielectric layers which in turn define vacuum evacuated or gas filled (such as but not limited to air filled) voids interposed between the patterns of patterned microelectronics conductor layers are particularly desirable within the art of microelectronics fabrication. Such methods are desirable since vacuum evacuated or gas filled voids typically yield within a microelectronics fabrication a dielectric layer possessing in the pertinent locations interposed between a series of patterns which comprises a patterned microelectronics conductor layer a dielectric constant approaching the theoretical lower limit of 1.0. For comparison purposes, conventional silicon containing dielectric layers formed of silicon containing dielectric materials such as but not limited to silicon oxide dielectric materials, silicon nitride dielectric materials and silicon oxynitride dielectric materials typically exhibit homogeneous dielectric constants within a range of from about 4.0 to about 9.0. Similarly, alternative low dielectric constant dielectric layers formed from low dielectric constant dielectric materials such as but not limited to organic polymer spin-on-polymer (SOP) dielectric materials (such as but not limited to polyimide organic polymer spin-on-polymer (SOP) dielectric materials, poly (arylene ether) organic polymer spin-on-polymer (SOP) dielectric materials and fluorinated poly (arylene ether)organic polymer spin-on-polymer (SOP) dielectric materials), amorphous carbon dielectric materials and silsesquioxane spin-on-glass (SOG) dielectric materials (such as but not limited to hydrogen silsesquioxane (HSQ) spin-on-glass (SOG) dielectric materials, carbon bonded hydrocarbon (MSQ) silsesquioxane spin-on-glass (SOG) dielectric materials and carbon bonded fluorocarbon silsesquioxane (FSQ) spin-on-glass (SOG) dielectric materials) typically exhibit somewhat lower homogeneous dielectric constants in a range of from about 2.5 to about 3.3.

It is therefore towards the goal of forming within microelectronics fabrications low dielectric constant dielectric layers which define, at least in part, vacuum evacuated or gas filled voids interposed between the patterns of patterned conductor layers upon which are formed those low dielectric constant dielectric layers, that the present invention is more generally directed.

Various methods and associated microelectronics structures have been disclosed within the art of microelectronics fabrication for forming upon patterned microelectronics conductor layers within microelectronics fabrications microelectronics dielectric layers which at least in part define vacuum evacuated or gas filled voids interposed between the patterns which comprise patterned conductor layers within microelectronics fabrications.

For example, Graven et al., in U.S. Pat. No. 5,641,712, disclose a method for forming a dielectric layer which define a series of voids between conducting lines thus reducing capacitance between the conducting lines. The voids are formed when a silane oxide layer is deposited over the lines to form a nearly closed trench-like gap in the oxide between the lines which is subsequently closed off at the top and sealed by resputtering the top surface of the oxide.

Further, Havemann et al., in U.S. Pat. No. 5,461,003, disclose another method which employs a dielectric layer for forming voids between metal layer leads of a semiconductor device. The voids are formed by depositing first a disposable solid layer between the metal layer leads, covering said leads and disposable layer with a porous dielectric layer, and removing the disposable layer through the porous covering dielectric layer.

Still further, Stoltz et al., in U.S. Pat. No. 5,407,860, disclose a method for defining a series of voids interposed between a series of patterns which comprises a patterned conductor layer within an integrated circuit microelectronics fabrication when forming upon the patterned conductor layer within the integrated circuit microelectronics fabrication a dielectric layer. The method employs a non-wetting material formed upon at least the sidewalls of the series of patterns which comprises the patterned conductor layer but not completely occupying the spaces between the series of patterns which comprises the patterned conductor layer nor upon the top surfaces of the series of patterns which comprises the patterned conductor layer. Thus, when a dielectric layer is subsequently formed upon the patterned conductor layer having the non-wetting material selectively formed upon portions of its patterns there is formed a series of voids beneath the dielectric layer, where the series of voids is formed interposed between the series of patterns which comprises the patterned conductor layer.

Finally, Sliwa et al., in U.S. Pat. No. 5,192,715, disclose a method for producing voids selectively at the sidewalls of aluminum lines within a microelectronics fabrication coated with tungsten. The method employs a selective deposition and dissolution of a sacrificial tungsten layer upon the sidewalls of the aluminum lines.

Desirable in the art of microelectronics fabrication are additional methods and materials which may be employed for forming a dielectric layer over a patterned microelectronics layer within a microelectronics fabrication, such that a series of vacuum evacuated or gas filled voids is defined interposed between a series of patterns which comprises the patterned microelectronics layer when forming the dielectric layer over the patterned microelectronics layer. More particularly desirable in the art of integrated circuit microelectronics fabrication are additional methods and materials which may be employed for forming a dielectric layer over a patterned conductor layer within an integrated circuit microelectronics fabrication, such that a series of vacuum evacuated or gas filled voids is formed interposed between a series of patterns which comprises the patterned conductor layer when forming the dielectric layer over the patterned conductor layer.

It is towards the foregoing goals that the present invention is both generally and more specifically directed.

SUMMARY OF THE INVENTION

A first object of the present invention is to provide a method for forming a dielectric layer over a patterned microelectronics conductor layer within a microelectronics fabrication.

A second object of the present invention is to provide a method in accord with the first object of the present invention, where a series of voids is defined interposed between a series of patterns which comprises the patterned microelectronics conductor layer when forming the dielectric layer over the patterned microelectronics conductor layer.

A third object of the present invention is to provide a method in accord with the first object of the present invention or the second object of the present invention, where the microelectronics fabrication is an integrated circuit microelectronics fabrication and the patterned conductor layer is a patterned conductor metal layer formed within the integrated circuit microelectronics fabrication.

A fourth object of the present invention is to provide a method in accord with the first object of the present invention, the second object of the present invention or the third object of the present invention, which method is readily commercially implemented.

In accord with the objects of the present invention, there is provided by the present invention a method for forming a dielectric layer within a microelectronics fabrication. To practice the method of the present invention, there is first provided a substrate employed within a microelectronics fabrication. There is then formed upon the substrate a substrate layer. There is then formed over the substrate layer a pair of patterned conductor stack layers, the pair of patterned conductor stack layers comprising a pair of patterned titanium nitride layers formed upon the substrate layer, and a pair of patterned aluminum containing conductor layers formed upon the pair of patterned titanium nitride layers. There is then formed upon the pair of patterned conductor stack layers and a portion of the substrate layer exposed interposed between the pair of patterned conductor stack layers a gap filling dielectric layer formed employing an ozone assisted sub-atmospheric pressure thermal chemical vapor deposition (SACVD) method. Within the aforesaid method of deposition of the gap filling dielectric layer, there are selected a substrate layer composition, a patterned conductor stack layer separation, a titanium nitride layer thickness and at least one of the ozone assisted sub-atmospheric pressure thermal chemical vapor deposition (SACVD) method parameters of temperature and pressure such that there is formed within the gap filling dielectric layer a void interposed between the pair of patterned conductor stack layers.

The present invention provides a method for forming a dielectric layer over a patterned microelectronics conductor layer within a microelectronics fabrication, where a series of voids is formed interposed between a series of conductive patterns which comprises the patterned microelectronics conductor layer. The present invention realizes the foregoing objects by employing when forming the patterned microelectronics conductor layer a pair of patterned conductor metal stack layers formed upon a substrate layer, where the pair of patterned conductor metal stack layers comprises a pair of patterned titanium nitride layers having formed and aligned thereupon a pair of patterned aluminum containing conductor layers. Thereafter, the pair of patterned conductor metal stack layers gives rise to the inhibition of the initial rate of deposition of the gap filing dielectric layer formed thereupon employing an ozone assisted sub-atmospheric pressure thermal chemical vapor deposition (SACVD) method within a preferred pressure range such that upon completion of the dielectric layer, there is formed a void interposed between the pair of patterned conductor metal stack layers.

The present invention may be employed where the microelectronics fabrication is an integrated circuit microelectronics fabrication and where the patterned microelectronics conductor layer is a patterned conductor metal layer formed within the integrated circuit microelectronics fabrication. The method of the present invention does not discriminate with respect to the nature of a microelectronics fabrication within which there may be formed a series of voids interposed between a series of patterns which comprises a patterned microelectronics conductor layer in accord with the method of the present invention, provided that the patterned microelectronics conductor layer comprises a pair of patterned titanium nitride layers having formed thereupon a pair of patterned aluminum containing conductor layers. Thus, although the method of the present invention is most likely to provide value when forming a series of voids interposed between a series of patterns which comprises a patterned conductor layer within an integrated circuit microelectronics fabrication, the method of the present invention may also be employed when forming a series of voids interposed between a series of patterns which comprises a patterned microelectronics conductor layer, within microelectronics fabrications including but not limited to integrated circuit microelectronics fabrications, charge coupled device microelectronics fabrications, solar cell microelectronics fabrications, ceramic substrate microelectronics fabrications and flat panel display microelectronics fabrications.

The method of the present invention is readily commercially implemented. The method of the present invention employs an ozone assisted sub-atmospheric pressure thermal chemical vapor deposition (SACVD) method within a preferred pressure range to deposit a silicon oxide dielectric layer with inhibited rates of initial formation upon and between the series of patterned microelectronics conductor layers which comprises the patterned microelectronics conductor layer due to an enhanced surface sensitivity, followed by subsequent deposition of the dielectric layer at an uninhibited rate to produce the voids within the dielectric layer which are closed off at the top of the voids. Since methods for forming the dielectric layer employed within the method of the present invention are generally known within the art of microelectronics fabrication, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming a dielectric layer over a patterned microelectronics conductor layer within a microelectronics fabrication, where a series of voids is formed interposed between a series of patterns which comprises the patterned microelectronics conductor layer when forming the dielectric layer over the patterned microelectronics conductor layer. The method of the present invention realizes this object by forming a silicon oxide dielectric layer over the patterned microelectronics conductor layer employing an ozone assisted sub-atmospheric pressure thermal chemical vapor deposition (SACVD) method within a preferred pressure range which provides an initially hindered rate of deposition due to an enhanced surface sensitivity, so that during subsequent deposition of the silicon oxide dielectric layer, there is formed a series of apertures defined at least in part by the silicon oxide dielectric layer, where the series of apertures is formed interposed between the patterns which comprise the patterned metal conductor layer, and where the series of voids is formed when the deposited silicon oxide dielectric material closes off the tops of the apertures to form a series of voids.

First Preferred Embodiment

Figure 1:
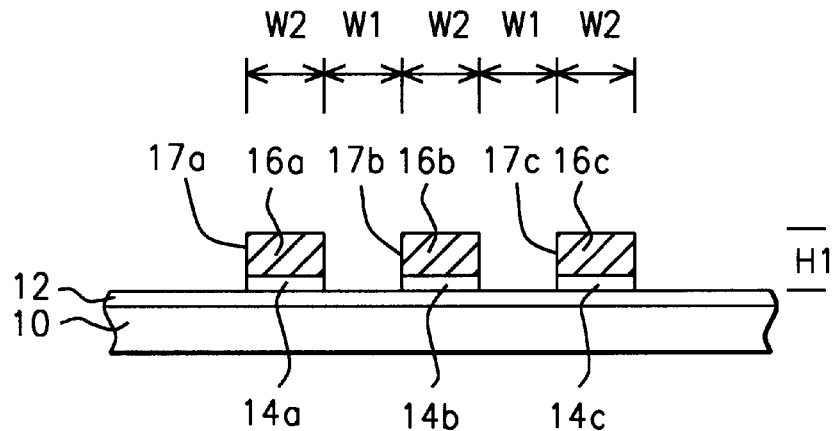
FIG. 1, FIG. 2 and FIG. 3 show a series of schematic cross-sectional diagrams illustrating the results of forming within a microelectronics fabrication in accord with a general embodiment of the present invention which comprises a first preferred embodiment of the present invention a dielectric layer over a patterned microelectronics conductor layer within the microelectronics fabrication to define a series of voids interposed between a series of patterns which comprises the patterned microelectronics conductor layer.
Figure 2:
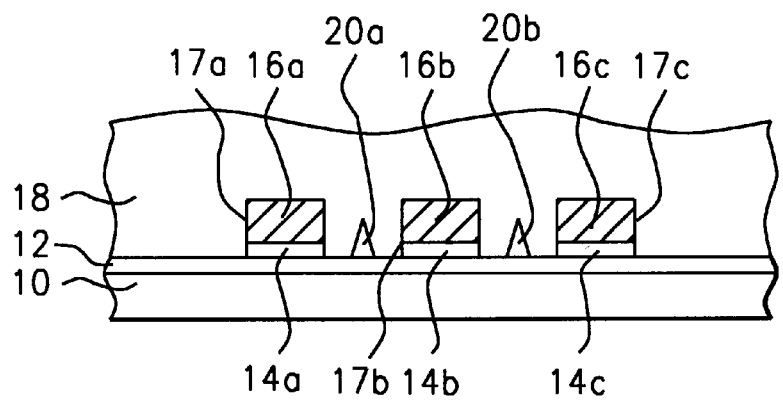
Figure 3:
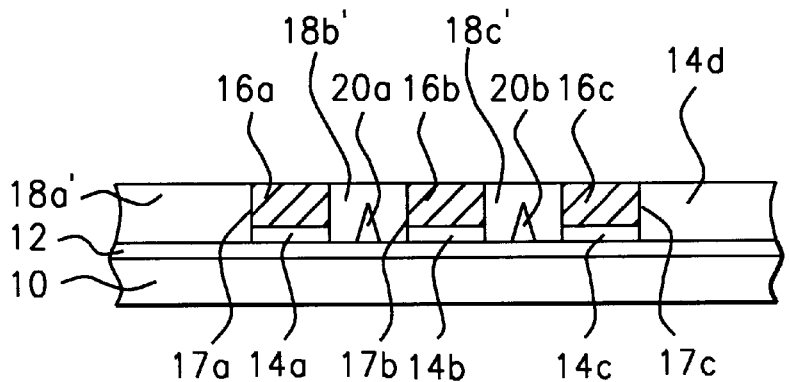

Referring now to FIG. 1 to FIG. 3, there is shown a series of schematic cross-sectional diagrams illustrating the results of forming within a microelectronics fabrication in accord with a general embodiment of the present invention which comprises a first preferred embodiment of the present invention a dielectric layer over a patterned microelectronics conductor layer within the microelectronics fabrication to define a series of voids interposed between a series of patterns which comprises the patterned microelectronics conductor layer. Shown in FIG. 1 is a schematic cross-sectional diagram of the microelectronics fabrication at an early stage in its fabrication in accord with the first preferred embodiment of the present invention.

Shown in FIG. 1 is a substrate 10 employed within a microelectronics fabrication, where the substrate has formed thereupon a substrate layer 12. A series of patterned microelectronics conductor stack layers are formed upon the substrate layer 12, comprising a first series of patterned conductor layers 14a, 14b and 14c upon which are formed and aligned a second series of patterned conductor layers 16a, 16b and 16c to form a series of patterned microelectronics conductor stack layers 17a, 17b and 17c of height H1 upon the substrate layer 12.

Within the first preferred embodiment of the present invention, the substrate 10 may be a substrate employed within a microelectronics fabrication selected from the group including but not limited to integrated circuit microelectronics fabrications, charge coupled device microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate 10 may be the substrate employed within the microelectronics fabrication, where the substrate has any of several additional microelectronics layers such as the substrate layer 12 formed thereupon or thereover. Such additional microelectronics substrate layers (similarly with the substrate 10 itself) may include, but are not limited to microelectronics conductor substrate layers, microelectronics semiconductor substrate layers and microelectronics dielectric substrate layers.

With respect to the substrate layer 12 shown in FIG. 1, the substrate layer 12 is a microelectronics dielectric layer formed of silicon containing dielectric materials including but not limited to silicon oxide dielectric material, silicon nitride dielectric material and silicon oxynitride dielectric material, employing methods including but not limited to thermal oxidation methods, chemical vapor deposition (CVD) methods, physical vapor deposition (PVD) sputtering methods and reactive sputtering methods. Preferably, the microelectronics dielectric layer 12 is a silicon nitride dielectric layer formed employing chemical vapor deposition (CVD) methods.

With respect to the patterned microelectronics conductor stack layer, the patterned first conductor layers 14a, 14b and 14c are formed from titanium nitride. Although the second patterned conductor layer or layers 16a, 16b and 16c may be formed from any of several types of microelectronics conductive materials as are known in the art of microelectronics fabrication, including but not limited to aluminum, copper, gold, tungsten, nickel and conductive compounds and alloys and mixtures thereof, preferably the patterned second conductor layers 16a, 16b and 16c are formed from aluminum containing material. The patterned first conductor layers 14a, 14b and 14c may each have a thickness upon the substrate layer 12 of from about 200 to about 500 angstroms and a linewidth W2 upon the substrate layer 12 of from about 0.2 to about 1.0 microns. As is specifically illustrated within the schematic cross-sectional diagram of FIG. 1 each patterned microelectronics conductor stack layer 17a, 17b and 17c is preferably separated by a pitch width W1 of from about 0.35 to about 0.6 microns over the substrate layer 12. Preferably the patterned second conductor layer 16a, 16b and 16c is formed to a thickness of from about 3000 to about 8000 angstroms.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein there is formed over and upon the substrate 10 and the patterned microelectronics conductor stack layers 17a, 17b and 17c a silicon oxide dielectric layer 18 formed employing an ozone assisted sub-atmospheric pressure thermal chemical vapor deposition (SACVD) method employing tetra-ethyl-orthosilicate (TEOS) as a silicon source material. Formed within the silicon oxide dielectric layer 18 is shows a pair of voids 20a and 20b formed interposed between the patterned microelectronics conductor stack layers 17a, 17b and 17c, where the pair of voids 20a and 20b is defined at least in part by the silicon oxide dielectric layer 18. Preferably, the ozone assisted sub-atmospheric pressure thermal chemical vapor deposition (SACVD) method employs: (1) a reactor chamber pressure of from about 450 to about 600 torr (which typically inherently precludes plasma activation); (2) a substrate temperature of from about 440 to about 480 degrees centigrade; (3) an ozone concentration of from about 10 to about 16 weight percent in an oxygen carrier gas flow rate of from about 4000 to about 6000 standard cubic centimeters per minute (sccm); (4) a tetra-ethyl-ortho-silicate (TEOS) concentration of from about 30 to about 40 standard cubic centimeters per minute (sccm) gas flow rate of TEOS in a helium carrier gas flow rate of from about 1500 to about 2500 standard cubic centimeters per minute (sccm). Preferably, the silicon oxide dielectric layer is formed to a thickness of from about 4000 to about 6000 angstroms.

As noted above, there is shown in FIG. 2 a pair of voids 20a and 20b formed interposed between the patterned microelectronics conductor stack layers 17a, 17b and 17c, where the pair of voids 20a and 20b is defined at least in part by the silicon oxide dielectric layer 18. The deposition rate of the silicon oxide dielectric layer 18 is initially inhibited when the silicon oxide dielectric layer 18 is formed directly on titanium nitride first patterned conductor layer surfaces due to an enhanced surface sensitivity, hence the formation of voids 20a and 20b is most likely to occur at the beginning of deposition of the silicon oxide dielectric layer 18, and the width of the voids decreases as deposition of the silicon oxide dielectric layer 18 progresses, until the voids 20a and 20b are closed over at the top below the height H1 of the patterned microelectronics conductor stack layers 17a, 17b and 17c.

Referring now to FIG. 3, there is shown a schematic cross-sectional diagram illustrating the results of a further stage in the fabrication of the microelectronics fabrication whose schematic cross-sectional diagram is shown in FIG. 2. Shown in FIG. 3 is a schematic cross-sectional diagram of a microelectronics fabrication otherwise equivalent to the microelectronics fabrication shown in FIG. 2, but wherein the microelectronics fabrication has been planarized by chemical mechanical polish (CMP) planarization method to render essentially co-planar the tops of the remaining silicon oxide dielectric layer 18' and the tops of the series of patterned microelectronics conductor stack layers 17a, 17b and 17c. The size of the series of voids 20a and 20b has been determined by the choice of the height H1 of the patterned microelectronics conductor stack layers 17a, 17b and 17c and the gaps W1 between the patterned microelectronics metal layers 17a, 17b and 17c and the process parameters for forming the silicon oxide dielectric layer employing the ozone assisted sub-atmospheric pressure thermal chemical vapor deposition (SACVD) method within a preferred pressure range such that the tops of the voids 20a and 20b are closed off below the height H1 of the patterned microelectronics conductor stack layers 17a, 17b and 17c, so that voids 20a and 20b are not uncovered or exposed due to the chemical mechanical polish (CMP) planarization processing. The size and positioning of the pair of voids 20a and 20b formed interposed between the patterned microelectronics conductor stack layers 17a, 17b and 17c are related to the gap height H1 and the gap widths W1 separating adjoining patterned microelectronics conductor stack layers 17a, 17b and 17c, as illustrated within the schematic cross-sectional diagram of FIG. 1, in conjunction with the values of parameters employed in forming the silicon oxide dielectric layer 18 as illustrated in FIG. 2.

The thickness of the patterned first conductor layer 14a, 14b and 14c of titanium nitride determines the sizes of the voids 20a and 20b which are formed. The voids 20a and 20b are formed larger as the thickness of the patterned first conductor layer 14a, 14b and 14c of titanium nitride increases due to the greater degree of inhibition of the deposition rate of the silicon oxide layer 18 caused by the greater thickness of the titanium nitride layer. As the deposition of silicon oxide layer 18 progresses, the diminished portion of the silicon oxide layer due to the inhibition of the first conductive layer of titanium nitride eventually decreases and the voids 20a and 20b close over below the height H1 of the patterned microelectronics conductor stack layer 17a, 17b and 17c.

Upon forming the microelectronics fabrication whose schematic cross-sectional diagram is illustrated within FIG. 3, there is formed a microelectronics fabrication having formed therein a series of voids interposed between a series of patterns which comprises a patterned microelectronics metal layer, when forming over the patterned microelectronics metal layer a dielectric layer.

Second Preferred Embodiment

Figure 4:
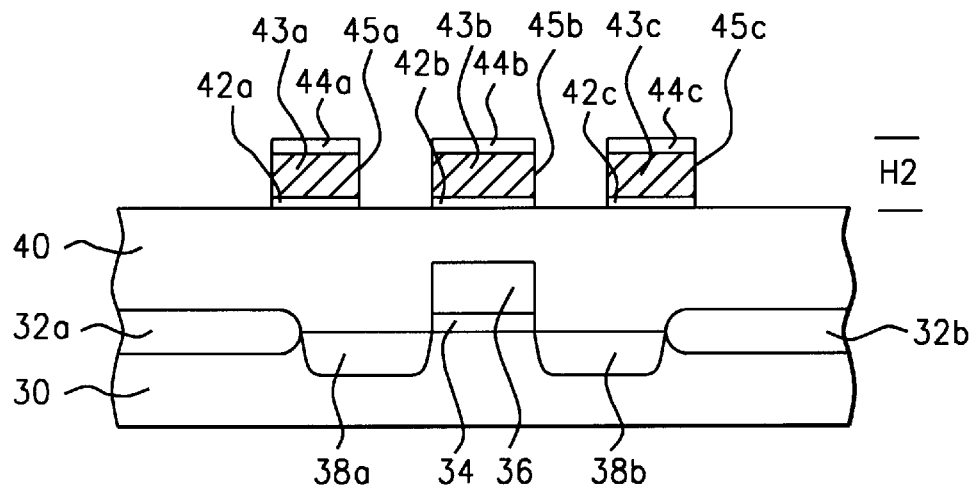
FIG. 4, FIG. 5 and FIG. 6 show a series of schematic cross-sectional diagrams illustrating the results of forming within an integrated circuit microelectronics fabrication in accord with a more specific embodiment of the present invention which comprises a second preferred embodiment of the present invention a dielectric layer over a patterned metal conductor layer within the integrated circuit microelectronics fabrication to form a series of voids interposed between a series of patterns which comprises the patterned metal conductor layer.
Figure 5:
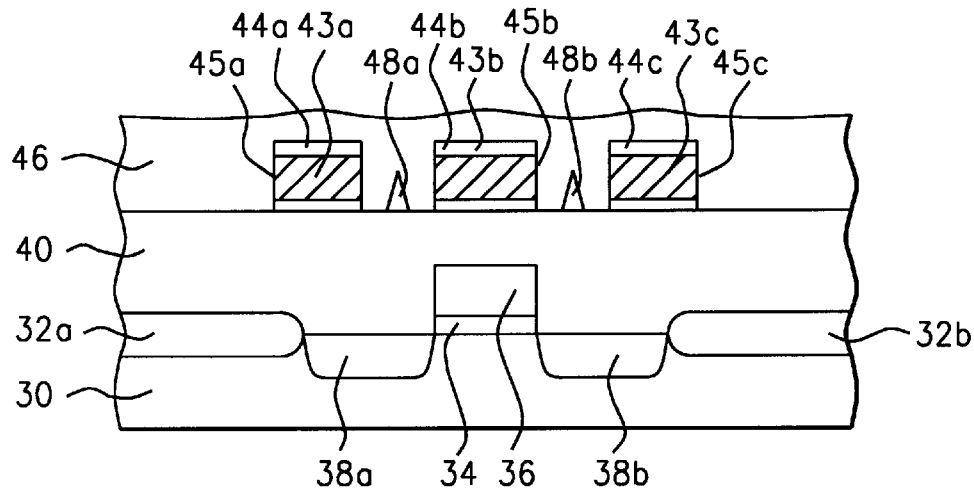
Figure 6:
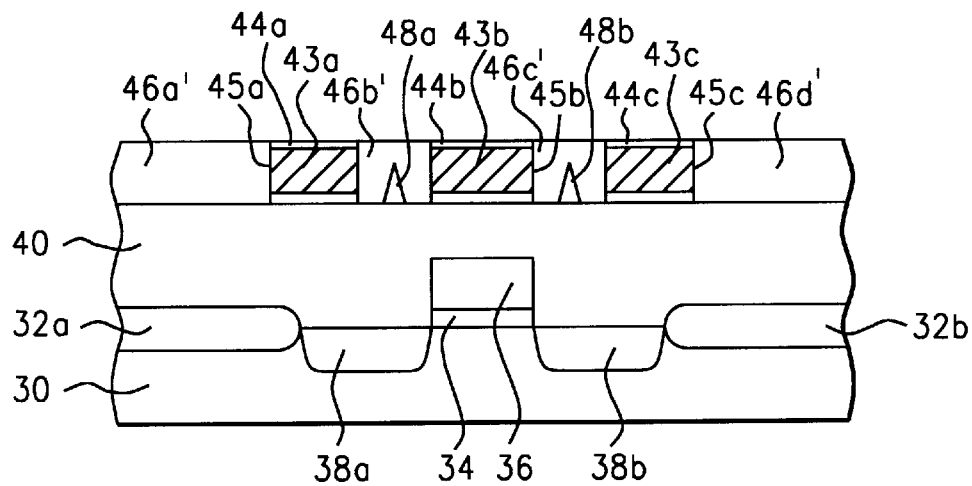

Referring now to FIG. 4 to FIG. 6, there is shown a series of schematic cross-sectional diagrams illustrating the results of forming within an integrated circuit microelectronics fabrication in accord with a more specific embodiment of the present invention which comprises a second preferred embodiment of the present invention a dielectric layer over a patterned conductor metal layer within the integrated circuit microelectronics fabrication to define a series of voids interposed between a series of patterns which comprises the patterned conductor metal layer.

Shown in FIG. 4 is a schematic cross-sectional diagram of an integrated circuit microelectronics fabrication at an early stage in its fabrication in accord with the second preferred embodiment of the present invention. Shown in FIG. 4 is a semiconductor substrate 30 having formed within and upon its surface a pair of isolation regions 32a and 32b which define an active region of the semiconductor substrate 30.

Although it is known in the art of integrated circuit microelectronics fabrication that semiconductor substrates are available with either dopant polarity, various dopant concentrations and several crystallographic orientations, for the second preferred embodiment of the present invention the semiconductor substrate is preferably a (100) silicon semiconductor substrate having an N- or P-doping.

Similarly, although it is also known in the art of integrated circuit microelectronics fabrication that isolation regions may be formed within and/or upon semiconductor substrates to define active regions of those semiconductor substrates employing methods including but not limited to isolation region thermal growth methods and isolation region deposition/patterning methods, for the second preferred embodiment of the present invention the isolation regions 32a and 32b are preferably formed within and upon the semiconductor substrate 30 to define the active region of the semiconductor substrate 30 employing an isolation region thermal growth method at a temperature of from about 800 to about 1000 degrees centigrade to form the isolation regions 32a and 32b of silicon oxide within and upon the semiconductor substrate 30.

Shown also within FIG. 4 formed within and upon the active region of the semiconductor substrate 30 is a field effect transistor (FET) which comprises a series of structures including: (1) a gate dielectric layer 34 formed upon the active region of the semiconductor substrate 30, the gate dielectric layer 34 having formed and aligned thereupon; (2) a gate electrode 36; and (3) a pair of source/drain regions 38a and 38b formed within the active region of the semiconductor substrate 30 at areas not covered by the gate dielectric layer 34 and the gate electrode 36. Each of the structures within the series of structures which comprises the field effect transistor (FET) may be formed employing methods and materials which are conventional in the art of field effect transistor (FET) fabrication.

For example, although it is known in the art of field effect transistor (FET) fabrication that gate dielectric layers may be formed through patterning, employing methods as are conventional in the art, of blanket gate dielectric layers formed upon active regions of semiconductor substrates employing methods including but not limited to blanket gate dielectric layer thermal growth methods and blanket gate dielectric layer deposition/patterning methods, for the second preferred embodiment of the present invention the gate dielectric layer 34 is preferably formed through patterning, employing methods as are conventional in the art of a blanket gate dielectric layer formed employing a blanket gate dielectric layer thermal growth method at a temperature of from about 700 to about 900 degrees centigrade to form the gate dielectric layer 34 of silicon oxide of thickness from about 30 to about 50 angstroms upon the active region of the semiconductor substrate 30.

Similarly, although it is also known in the art of field effect transistor (FET) fabrication that gate electrodes may be formed through patterning, employing methods as are conventional in the art, of blanket gate electrode material layers formed of gate electrode materials including but not limited to metals, metal alloys, doped polysilicon or polycides (doped polysilicon/metal silicide stacks), for the second preferred embodiment of the present invention the gate electrode 36 is preferably formed through patterning, employing methods as are conventional in the art, of a blanket layer of a doped polysilicon or a polycide gate electrode material formed upon the blanket gate dielectric layer 34 to a thickness of from about 1600 to about 2200 angstroms.

Finally, it is also known in the art of field effect transistor (FET) fabrication that source/drain regions are typically formed into active regions of a semiconductor substrate employing ion implantation methods which employ dopant ions of polarity opposite the polarity of the semiconductor substrate within which is formed those source/drain regions. For the second preferred embodiment of the present invention, the source/drain regions 38a and 38b are preferably formed within the active region of the semiconductor substrate 30 employing a high dose ion implant at an ion implant dose of from about $1 \times 10^{15}$ to about $5 \times 10^{15}$ dopant ions per square centimeter and at an ion implantation energy of from about 5 to about 60 keV while employing at least the gate electrode 36 and the gate dielectric layer 34 as an ion implantation mask. The high dose ion implant is of P| or N| polarity appropriate to the field effect transistor (FET) and the semiconductor substrate 30.

There is also shown within FIG. 4 formed over the semiconductor substrate 30 and the series of structures which forms the field effect transistor (FET) a planarized pre-metal dielectric layer (PMD) 40. Methods and materials through which planarized pre-metal dielectric (PMD) layers may be formed within integrated circuit microelectronics fabrications are known in the art of microelectronics fabrications. Planarized pre-metal dielectric (PMD) layers may be formed within microelectronics fabrications employing methods including but not limited to chemical vapor deposition (CVD) methods, plasma enhanced chemical vapor deposition (PECVD) methods and physical vapor deposition (PVD) sputtering methods, along with reactive ion etch (RIE) etchback planarizing methods and chemical mechanical polish (CMP) planarizing methods, through which may be formed planarized pre-metal dielectric(PMD) layers of dielectric materials including but not limited to silicon oxide dielectric materials, silicon nitride dielectric materials and silicon oxynitride dielectric materials. For the second preferred embodiment of the present invention, the planarized pre-metal dielectric (PMD) layer 40 is preferably formed of a silicon oxide dielectric material deposited employing a plasma enhanced chemical vapor deposition (PECVD) method and subsequently planarized employing a chemical mechanical polish (CMP) planarizing method, as is common in the art of integrated circuit microelectronics fabrication. Other methods and materials may, however, also be employed in forming the planarized pre-metal dielectric (PMD) layer 40. Preferably, the planarized pre-metal dielectric (PMD) layer 40 so formed is formed to a thickness of from about 7000 to about 9000 angstroms over the semiconductor substrate 30 and the series of structures which forms the field effect transistor (FET).

There is also shown in FIG. 4 a series of patterned first conductor barrier layers 42a, 42b and 42c formed upon the blanket planarized pre-metal dielectric (PMD) layer 40. Methods and materials through which patterned conductor barrier layers may be formed within integrated circuit microelectronics fabrications are known in the art of microelectronics fabrications. Patterned conductor barrier layers are typically formed within integrated circuit microelectronics fabrications employing methods including but not limited to thermally assisted evaporation methods, electron beam assisted evaporation methods, chemical vapor deposition (CVD) methods and physical vapor deposition (PVD) sputtering methods, in conjunction with photolithographic and etching methods, through which may be formed patterned conductor barrier layers of conductor barrier materials including but not limited to metal compounds, metal alloys, highly doped polysilicon and polycides (highly doped polysilicon/metal silicide stacks). For the second preferred embodiment of the present invention, the patterned first conductor barrier layers 42a, 42b and 42c are preferably each formed of a titanium nitride conductor layer, above which is then formed a co-extensive conductor layer 43a, 43b and 43c.

Methods and materials through which patterned conductor layers may be formed within integrated circuit microelectronics fabrications are known in the art of integrated circuit microelectronics fabrication. Patterned conductor layers are typically formed within integrated circuit microelectronics fabrications employing methods including but not limited to thermally assisted evaporation methods, electron beam assisted evaporation methods, chemical vapor deposition (CVD) methods and physical vapor deposition (PVD) sputtering methods, in conjunction with photolithographic and etching methods. For the second preferred embodiment of the present invention, the patterned first metal conductor layers 43a, 43b and 43c are each formed from an aluminum containing conductor material, above each of which may be formed an optional co-extensive barrier layer 44a, 44b and 44c analogous or equivalent to the conductor barrier layers 42a, 42b and 42c. The formation of the series of patterned barrier conductor layers 42a, 42b and 43c, the series of first conductor layers 43a, 43b and 43c and the optional series of patterned barrier conductor layers 44a, 44b and 44c altogether constitute a series of patterned microelectronics conductor stack layers 45a, 45b and 45c of height H2. Preferably, each of the series of patterned microelectronics conductor stack layers 45a, 45b and 45c is formed to, and separated by, dimensions analogous or equivalent to the dimensions employed when forming and separating the series of patterned microelectronics conductor stack layers 17a, 17b and 17c within the first preferred embodiment of the present invention as illustrated within the schematic cross-sectional diagram of FIG. 1.

Referring now to FIG. 5, there is shown a schematic cross-sectional diagram illustrating the results of further processing of the integrated circuit microelectronics fabrication whose schematic cross-sectional diagram is shown in FIG. 4. Shown in FIG. 5 is a schematic cross-sectional diagram of an integrated circuit microelectronics fabrication otherwise equivalent to the integrated circuit microelectronics fabrication whose schematic cross-sectional diagram is shown in FIG. 4, but wherein there is formed upon and over the patterned microelectronics conductor stack layers conductor layers 45a, 45b and 45c a silicon oxide dielectric layer 46, where the silicon oxide dielectric layer 46 defines a pair of voids 48a and 48b formed interposed between the patterned microelectronics conductor stack layers 45a, 45b and 45c.

Within the preferred second embodiment of the present invention, the silicon oxide dielectric layer 46 is preferably formed employing materials, methods and dimensions analogous or equivalent to the materials, methods and dimensions employed in forming the silicon oxide dielectric layer 18 within the first preferred embodiment of the present invention as illustrated within the schematic cross-sectional diagram of FIG. 2. Thus, the pair of voids 48a and 48b defined by the silicon oxide dielectric layer 46 as illustrated within the schematic cross-sectional diagram of FIG. 5 is formed for reasons analogous or equivalent to the reasons for which are formed the pair of voids 20a and 20b defined at least in part by the silicon oxide dielectric layer 14 as illustrated within the schematic cross-sectional diagram of FIG. 2.

Referring now to FIG. 6, there is shown a schematic cross-sectional diagram illustrating the results of further processing of the integrated circuit microelectronics fabrication whose schematic cross-sectional diagram is shown in FIG. 5. Shown in FIG. 6 is a schematic cross-sectional diagram of an integrated circuit microelectronics fabrication otherwise equivalent to the integrated circuit microelectronics fabrication shown in FIG. 5, but wherein the silicon oxide dielectric layer 46' has been planarized by chemical mechanical polish (CMP) planarization method to produce a series of patterned planarized dielectric layers 46a', 46b', 46c' and 46d'. The surfaces of the planarized dielectric layers 46a', 46b', 46c' and 46d' are formed higher than the tops of the pair of voids 48a and 48b.

As is understood by a person skilled in the art, the silicon oxide dielectric layer 46' as illustrated within the integrated circuit microelectronics fabrication whose schematic cross-sectional diagram is illustrated in FIG. 6 may be planarized, typically employing chemical mechanical polish (CMP) planarizing methods as are conventional in the art of integrated circuit microelectronics fabrication, to provide a planarized silicon oxide dielectric layer 46' upon which may be formed additional upper level patterned conductor layers and inter-metal dielectric (IMD) layers within the integrated circuit microelectronics fabrication whose schematic cross-sectional diagram is illustrated in FIG. 6, in accord with the method of the present invention. Such chemical mechanical polish (CMP) planarizing methods will typically not disturb voids, such as the pair of voids 48a and 48b formed interposed between the series of patterned microelectronics conductor stack layers 45a, 45b and 45c as illustrated within the schematic cross-sectional diagram of FIG. 6, since the conditions of silicon oxide dielectric layer deposition and the dimensions of the patterned microelectronics conductor stack layers 45a, 45b and 45c have formed the pair of voids 48a and 48b such that the tops of the voids are below the height H2 of the series of the patterned microelectronics conductor stack layers 45a, 45b and 45c. Thus, the low dielectric constant dielectric character provided by the silicon oxide dielectric layer 46' employed within the preferred second embodiment of the present invention or, by analogy, the silicon oxide dielectric layer 18' within the first preferred embodiment of the present invention, is preserved even when planarized employing methods as are conventional in the art of microelectronics fabrication.

EXAMPLE 1

Upon the surfaces of three (100) silicon semiconductor substrates were formed silicon oxide substrate layers and three-layer patterned microelectronics conductor stacks in accord with the schematic cross-sectional diagram illustrated in FIG. 4 to FIG. 6 and the accompanying description.

The silicon oxide insulator substrate layers were formed through a plasma enhanced chemical vapor deposition (PECVD) method employing tetra-ethyl-ortho-silicate (TEOS) as the silicon source material. The process parameters included: (1) a tetra-ethyl-ortho-silicate (TEOS) flow rate of from about 20 to about 50 standard cubic centimeters per minute (sccm); (2) an oxygen gas flow rate of from about 400 to about 800 standard cubic centimeters per minute (sccm); (3) a helium gas flow rate of from about 600 to about 1000 standard cubic centimeters per minute; and (4) a radio frequency power of from about 600 to about 800 watts at a frequency of 13.56 mHz.

Upon the silicon oxide dielectric layers were formed patterned titanium nitride barrier layers employing a physical vapor deposition (PVD) sputtering method from a titanium nitride sputtering target. The patterned titanium nitride layers were each formed to a thickness of about 1000 angstroms.

Upon the patterned titanium nitride barrier layers were formed co-extensive patterned aluminum containing metal conductor layers employing a physical vapor deposition (PVD) sputtering method. The aluminum containing conductor layers were each formed to a thickness of about 4000 angstroms.

Upon the patterned aluminum containing conductor layers were formed a patterned titanium nitride upper barrier layer co-extensive with the aluminum containing conductor layers. The patterned titanium nitride upper barrier layers were formed employing a physical vapor deposition (PVD) sputtering method from a titanium nitride target to a thickness of about 1000 angstroms.

Upon each of the three silicon semiconductor substrates having the equivalent silicon oxide dielectric layers and the equivalent patterned three-layer conductor layer stacks was then formed a silicon oxide dielectric layer in accord with the parameters preferred for the present invention. The silicon oxide dielectric layers were formed employing an ozone assisted sub-atmospheric pressure thermal chemical vapor deposition (SACVD) method within a preferred pressure range employing tetra-ethyl-ortho-silicate (TEOS) as the silicon source material. Additional parameters under which the silicon oxide dielectric layers were formed includes: (1) an ozone: tetra-ethyl-ortho-silicate molar ratio of from about 15:1 to about 30 1; (2) a reactor chamber pressure of from about 450 to about 600 torr; (3) a tetra-ethyl-ortho-silicate gas flow rate of from about 30 to about 40 standard cubic centimeters per minute (sccm); (4) a background helium gas flow rate of from about 4000 to about 6000 standard cubic centimeters per minute (sccm); (5) a substrate temperature of from about 440 to about 480 degrees centigrade; and (6) an oxygen (ozone carrier gas) flow rate of from about 4000 to about 6000 standard cubic centimeters per minute (sccm). Each of the three individual silicon oxide dielectric layers were formed upon the three equivalent silicon semiconductor substrates for a different time interval. The time intervals were 50 seconds, 150 seconds and 300 seconds.

After the three silicon oxide dielectric layers were formed upon the three equivalent silicon semiconductor substrates at the three different time intervals, there was measured: (1) the thicknesses of the silicon oxide dielectric layers over the silicon oxide substrate layers; (2) the thicknesses of the silicon oxide dielectric layers adjoining the exposed edges of the patterned conductor metal stack layers; and (3) the thicknesses of the three silicon oxide dielectric layers over the titanium nitride upper barrier layers.

Figure 7:
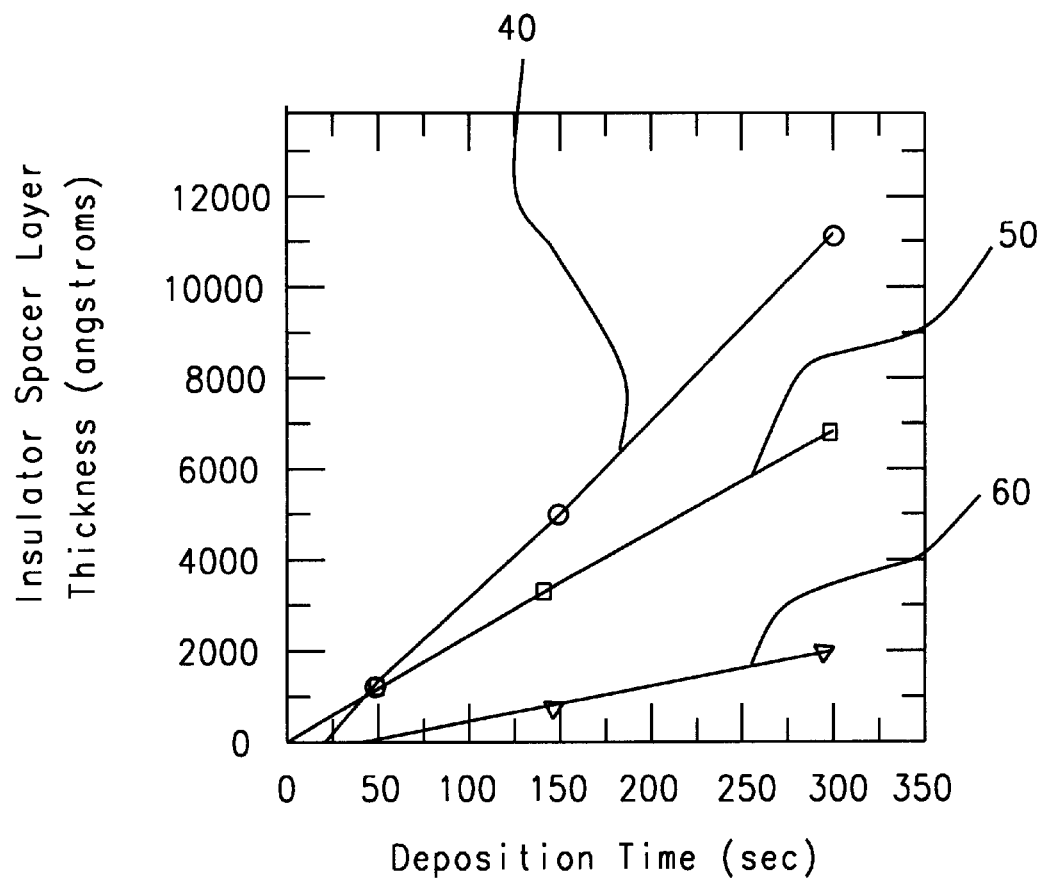
FIG. 7 is a graph of the thicknesses of silicon oxide dielectric layers deposited upon various surfaces as a function of time of deposition.

The measured thicknesses described above were plotted to yield the graph of FIG. 7. Within FIG. 7, line 40 corresponds to the thicknesses of the three silicon oxide dielectric layers formed over the silicon oxide substrate layers. Line 50 corresponds to the thicknesses of the three silicon oxide dielectric layers adjoining the exposed edges of the patterned aluminum contraining conductor stack layers. Finally, line 60 corresponds to the thicknesses of the three silicon oxide dielectric layers over the patterned titanium nitride upper barrier layers. From lines 40, 50 and 60 were calculated: (1) the slopes which correspond to the deposition rates of the silicon oxide dielectric layers upon the individual substrate materials; and, (2) the x-axis intercepts which correspond to the induction times for forming the silicon oxide dielectric layers upon those individual substrate materials. The deposition rates and incubation times are reported in TABLE I

TABLE I

Ozone-TEOS Layer Formation Rates and Induction Times

| Substrate Layer | Deposition Rate | Induction Time |
| --- | --- | --- |
| Titanium Nitride | 513 angstroms/minute | 52.7 seconds |
| Aluminum 1% Copper | 1442 angstroms/minute | 0.0 seconds |
| PECVD TEOS | 2280 angstroms/minute | 15.6 seconds |

From review of the data in TABLE I it is seen that the deposition rate of the silicon oxide dielectric layer formed employing the ozone assisted sub-atmospheric pressure thermal chemical vapor deposition (SACVD) method upon the titanium nitride barrier layers is exceedingly low in comparison with the deposition rate for the silicon oxide dielectric layers upon either the aluminum containing conductor layer or the silicon oxide substrate layer. Given this ordering of deposition rates, and the presence of a substantial incubation time for forming the silicon oxide dielectric layers upon titanium nitride barrier layers, the silicon oxide dielectric layers of the present invention may be readily formed elsewhere on microelectronics fabrication substrates but not upon or adjacent to patterned conductor stack layers within which are contained titanium nitride layers employed as lower barrier layers. The incubation time during which no silicon oxide deposition occurs on the exposed titanium nitride layer edges and the subsequent reduced deposition rate of silicon oxide on those edges result in the formation of voids at or adjacent to those edges which are eventually closed over at the top by subsequent silicon oxide deposition.

EXAMPLE 2

Upon the surfaces of four (100) silicon semiconductor substrates were formed silicon oxide substrate layers and three-layer patterned conductor stack layers in accord with the schematic cross-sectional diagram of FIG. 4 and the methods employed in the description of the silicon semiconductor substrates produced for Example 1. Upon the surface of one of the four silicon semiconductor substrates, designated as No. 1 in this Example, there was formed a conformal silicon oxide dielectric layer employing plasma assisted chemical vapor deposition (PECVD) method which is conventionally known in the art of microelectronics fabrication. Upon the surface of the other three silicon semiconductor wafers there was formed a silicon oxide dielectric layer employing an ozone assisted sub-atmospheric pressure thermal chemical vapor deposition (SACVD) method wherein tetra-ethyl-ortho-silicate (TEOS) was the silicon source material.

Upon the surface of the second of the four silicon semiconductor substrates, designated as No. 2 within this Example, the silicon oxide dielectric layer was formed not in accord with the general method of the present invention, but with the following differences in method: (1) an ozone-:TEOS molar ratio of 12; and (2) a silicon semiconductor substrate temperature of 400 degrees centigrade. On the surface of the third of the four silicon semiconductor substrates, designated as No. 3 within this Example, there was formed a silicon oxide dielectric layer not in accord with the general method of the present invention, but with the following differences in method: (1) an ozone:TEOS molar ratio of 29; and (2) a silicon semiconductor substrate temperature of 400 degrees centigrade. Upon the surface of the fourth of the four silicon semiconductor substrates, designated as No. 4 within this Example, there was formed a silicon oxide dielectric layer in accord with the general method of the present invention.

The four silicon semiconductor substrates which constitute the Example 2 were sectioned, polished and scanned by electron microscopy, and the regions between and adjoining the edges of the patterned conductor stack layers were examined for voids. The results are reported in TABLE II.

TABLE II

| Sample | SACVD Method | Void Size | Void Location | Reliability |
|--------|--------------|-----------|---------------|-------------|
| 1 | PECVD underlayer | none | — | good |
| 2 | ratio 12; T 400 C | none | — | — |
| 3 | ratio 29; T 400 C | small | irregular | — |
| 4 | ratio 12; T 400 C | large | between lines | good |

The formation of a void between patterned conductor stack lasers is not observed for the silicon semiconductor substrate No. 1 for which a silicon oxide dielectric underlayer was deposited employing plasma enhanced chemical vapor deposition (PECVD). However, the method does result in voids located in the upper portions of the silicon oxide dielectric layer, in which portion of the silicon oxide layer the voids are not positioned interposed between the patterned conductor stack layers, as is desired for a lower dielectric constant, but also the tops of the voids are above the tops of the patterned conductor stack layers. This location of the tops of the voids in the upper portion of the deposited silicon oxide dielectric layer will adversely affect subsequent planarization of the surface of the silicon oxide dielectric layer, since such planarization will open the voids and create pores or fissures in the planarized silicon oxide dielectric layer surface. Similarly, the voids in the silicon oxide dielectric layers formed upon the silicon semiconductor substrates No. 2 are nonexistent, and the voids formed in the silicon oxide layers formed upon silicon semiconductor substrate No. 3 employing ozone assisted sub-atmospheric pressure thermal chemical vapor deposition (SACVD) methods are inadequate in size because the silicon semiconductor substrate temperatures were below the lower limit of the method of the present invention. In these cases the differences between the incubation periods and the differences between deposition rates of silicon oxide on the various surfaces are not significant enough to allow the formation of voids of significant size, since the overall deposition rates are lowered by the reduced substrate temperatures.

As is understood by a person skilled in the art, the preferred embodiments of the present invention are illustrative of the present invention rather than limiting of the present invention. Revisions and modifications may be made to methods, materials, structures and dimensions through which are formed microelectronics fabrications in accord with the first preferred embodiment of the present invention and integrated circuit microelectronics fabrications in accord with the second preferred embodiment of the present invention while still providing microelectronics fabrications, including but not limited to integrated circuit microelectronics fabrications, in accord with the methods of the present invention, as defined by the appended claims.

What is claimed is:

1. A method for forming a dielectric layer comprising:
   providing a substrate;
   forming over the substrate a substrate layer;
   forming upon the substrate layer a pair of patterned conductor stack layers, the pair of patterned conductor stack layers comprising:
   a pair of patterned titanium nitride layers formed upon the substrate layer; and
   a pair of patterned aluminum containing conductor layers formed upon the pair of patterned titanium nitride layers; and
   forming upon the pair of patterned conductor stack layers and a portion of the substrate layer exposed interposed between the pair of patterned conductor stack layers a gap filling dielectric layer formed employing an ozone assisted sub-atmospheric pressure thermal chemical vapor deposition (SACVD) method, wherein:
   a substrate layer composition, a patterned conductor stack layer separation, a titanium nitride layer thickness and at least one of an ozone assisted sub-atmospheric pressure thermal chemical vapor deposition (SACVD) method deposition temperature and an ozone assisted sub-atmospheric pressure thermal chemical vapor deposition (SACVD) method deposition pressure are selected such that there is formed within the gap filling dielectric layer a void interposed between the pair of patterned conductor stack layers.

2. The method of claim 1 wherein the substrate is employed within a microelectronics fabrication selected from the group consisting of integrated circuit microelectronics fabrications, charge coupled device microelectronics fabrications, solar cell microelectronics fabrications, ceramic substrate microelectronics fabrications and flat panel display microelectronics fabrications.

3. The method of claim 1 wherein the substrate layer is selected from the group consisting of dielectric substrate layers, semiconductor substrate layers and conductor substrate layers.

4. The method of claim 1 wherein:
   the patterned conductor stack layer separation is from about 0.2 to about 1.0 microns;
   the titanium nitride layer thickness is from about 800 to about 1200 angstroms;
   the ozone assisted sub-atmospheric pressure thermal chemical vapor deposition (SACVD) method deposition temperature is from about 440 to about 480 degrees centigrade; and
   the ozone assisted sub-atmospheric pressure thermal chemical vapor deposition (SACVD) method deposition pressure is from about 450 to about 600 torr.

5. The method of claim 1 wherein the void does not extend above a pair of top surfaces of the pair of patterned conductor stack layers.

6. The method of claim 1 wherein there is not formed a pair of titanium nitride layers upon a pair of top surfaces of the pair of patterned conductor metal stack layers.

7. A method for forming a dielectric layer within an integrated circuit microelectronics fabrication comprising:
   providing a semiconductor substrate;
   forming over the semiconductor substrate a dielectric substrate layer;
   forming upon the dielectric substrate layer a pair of patterned conductor stack layers, the pair of conductor stack layers comprising:
   a pair of patterned titanium nitride layers formed upon the substrate layer;
   a pair of patterned aluminum containing conductor layers formed upon the pair of patterned titanium nitride layers; and
   forming upon the pair of patterned conductor stack layers and a portion of the substrate layer exposed interposed between the pair of patterned conductor stack layers a gap filling silicon oxide dielectric layer formed employing an ozone assisted sub-atmospheric pressure thermal chemical vapor deposition (SACVD) method wherein:

a substrate layer composition, a patterned conductor stack layer separation, a titanium nitride layer thickness and at least one of an ozone assisted sub-atmospheric pressure thermal chemical vapor deposition (SACVD) method deposition temperature and an ozone assisted sub-atmospheric pressure thermal chemical vapor deposition (SACVD) method deposition pressure are selected such that there is formed within the gap filling silicon oxide dielectric layer a void interposed between the pair of patterned conductor stack layers.

8. The method of claim 7 wherein the semiconductor substrate is a silicon semiconductor substrate and the integrated circuit microelectronics fabrication is a field effect transistor (FET) integrated circuit.

9. The method of claim 7 wherein the dielectric substrate layer is selected from the group consisting of silicon oxide, silicon nitride, and silicon oxynitride.

10. The method of claim 7 wherein the void does not extend above a pair of top surfaces of the pair of patterned conductor stack layers.

11. The method of claim 7 wherein there is not formed a pair of titanium nitride layers upon a pair of top surfaces of the pair of patterned conductor metal stack layers.

* * * * *